United States Patent
Dixon et al.

(10) Patent No.: US 7,591,600 B2
(45) Date of Patent: Sep. 22, 2009

(54) METHOD AND SYSTEM FOR MONITORING PHOTOLITHOGRAPHY PROCESSING BASED ON A BATCH CHANGE IN LIGHT SENSITIVE MATERIAL

(75) Inventors: David Dixon, Austin, TX (US); Bryan Swain, Richmond, VA (US)

(73) Assignee: Tokyo Electron Limited, Tokyo (JP)

( * ) Notice: Subject to any disclaimer, the term of this patent is extended or adjusted under 35 U.S.C. 154(b) by 403 days.

(21) Appl. No.: 11/678,410

(22) Filed: Feb. 23, 2007

(65) Prior Publication Data

US 2008/0204734 A1    Aug. 28, 2008

(51) Int. Cl.
*G03D 5/00* (2006.01)
*B05C 11/00* (2006.01)
*G03F 1/00* (2006.01)

(52) U.S. Cl. ............... 396/611; 396/578; 118/688; 118/712; 430/325

(58) Field of Classification Search ........... 396/578, 396/611; 118/52, 688, 689, 690, 691, 712; 355/27; 430/22, 325; 356/237.2

See application file for complete search history.

(56) References Cited

U.S. PATENT DOCUMENTS

| | | | |
|---|---|---|---|
| 6,536,964 B1* | 3/2003 | Kitano et al. | 396/611 |
| 2001/0041311 A1* | 11/2001 | Araki et al. | 430/325 |
| 2005/0191051 A1* | 9/2005 | Miyata | 396/611 |
| 2006/0144330 A1* | 7/2006 | Takekuma et al. | 118/682 |

* cited by examiner

*Primary Examiner*—Alan A Mathews
(74) *Attorney, Agent, or Firm*—Oblon, Spivak, McClelland, Maier & Neustadt, P.C.

(57) ABSTRACT

A method for monitoring photolithography processing includes monitoring application of a light sensitive material to the surface of each of a plurality of substrates and detecting that a supply of the light sensitive material applied to the substrates has changed from a first batch of light sensitive material to a second batch light sensitive material. A change in photolithography process results caused by the change from the first batch to the second batch of light sensitive material is determined. Also included is initiating corrective action based on the change in photolithography process results.

31 Claims, 6 Drawing Sheets

METHOD AND SYSTEM FOR MONITORING PHOTOLITHOGRAPHY PROCESSING BASED ON A BATCH CHANGE IN LIGHT SENSITIVE MATERIAL

BACKGROUND OF THE INVENTION

1. Field of the Invention

The disclosed invention relates generally to monitoring photolithography processing, and more specifically to monitoring changes in photolithography processing that occur due to a change in the batch of light sensitive material applied to a substrate.

2. Discussion of the Background

In material processing methodologies, pattern etching includes the application of a thin layer of light-sensitive material, such as photoresist, to an upper surface of a substrate that is subsequently patterned in order to provide a mask for transferring this pattern to the substrate during etching. The patterning of the light-sensitive material is typically referred to as photolithography processing and generally involves coating an upper surface of the substrate with a thin film of light-sensitive material, exposing the thin film of light-sensitive material to a radiation source through a reticle (and associated optics) using, for example, a micro-lithography system, followed by a developing process during which the removal of the irradiated regions of the light-sensitive material occurs (as in the case of positive photoresist), or the removal of non-irradiated regions occurs (as in the case of negative resist) using a developing solvent. As a result, a desired resist pattern is formed on the substrate. After a desired resist pattern is formed on the substrate, the wafer is transferred to an etching apparatus where an etching process is performed as a next step to transfer the resist pattern into the substrate.

Recently, the resist and etch patterns formed upon a substrate are required to be finer, and a severe control upon the line width of the resist and etch patterns has become inevitable. Thus, inspection of resist patterns on a substrate is typically carried out by a worker measuring a critical dimension (CD) of the resist pattern on the surface of a substrate brought out from the resist coating and developing system, with a Scanning Electron Microscope (SEM), and judging whether the measured value of the line width satisfies the required standards. These "CD-SEM" measurements can be used to make corrections to exposure energy, for example, in an effort to ensure that photoresist patterns meet target CDs. Similarly, strict inspection and control techniques are used to ensure that subsequent etch results are consistent with target resist patterns.

Despite these inspection and control efforts, however, a post-etch inspection can reveal a sudden change in measured CD of the etched feature. While the photolithography process and/or etch process may be modified to bring the CD back into tolerance, several wafers may be scrapped before the CD shift is detected and corrected, resulting in reduced product yield.

SUMMARY OF THE INVENTION

Accordingly, one object of the present invention is to reduce or solve any of the above and/or other problems associated with monitoring photolithography processing.

Another object of the invention is to improve the detection of photolithography process problems in order to improve manufacturing yields.

Still another object of the invention is to improve the detection of photolithography process problems caused by a batch change in light sensitive material.

These and/or other objects of the invention are provided by a method for monitoring photolithography processing. The method includes monitoring application of a light sensitive material to the surface of each of a plurality of substrates and detecting that a supply of the light sensitive material applied to the substrates has changed from a first batch of light sensitive material to a second batch light sensitive material. Also included is determining a change in photolithography process results caused by the change from the first batch to the second batch of light sensitive material, and initiating corrective action based on the change in photolithography process results.

Another aspect of the invention includes a system for monitoring photolithography processing. The system includes a coating device configured to apply light sensitive material to the surface of each of a plurality of substrates and a detector configured to detect that a supply of the light sensitive material applied to the substrates has changed from a first batch of light sensitive material to a second batch light sensitive material. Also included is an inspection device configured to determine a change in photolithography process results caused by the change from the first batch to the second batch of light sensitive material

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

As noted in the background section above, despite inspection and control efforts during the photolithography and etch processes, post-etch inspection can reveal a sudden change in a measured CD of an etched feature, which can lead to a costly reduction in manufacturing yield. It has been documented that these failed wafers can coincide with a batch change of the light sensitive material (also referred to herein as "resist") used in the photolithography process.

Specifically, the inventors learned that CD-SEM data from a photolithography process of the failed wafers revealed only a minor shift in CD that occurred at the time of batch change, which did not result in an out of tolerance process condition. Further, changes in exposure energy were implemented to move the CD-SEM measurements closer to the target CD. Even with this correction to the photolithography process, subsequent etching of the pattern resist resulted in the failed wafers. The inventors further learned that optical metrology data (more specifically Optical Digital Profilometry (ODP™) data, provided by an ODP system produced by Tokyo Electron Limited) for the failed wafers detected a photolithography process change associated with the resist batch change.

Figure 7A:
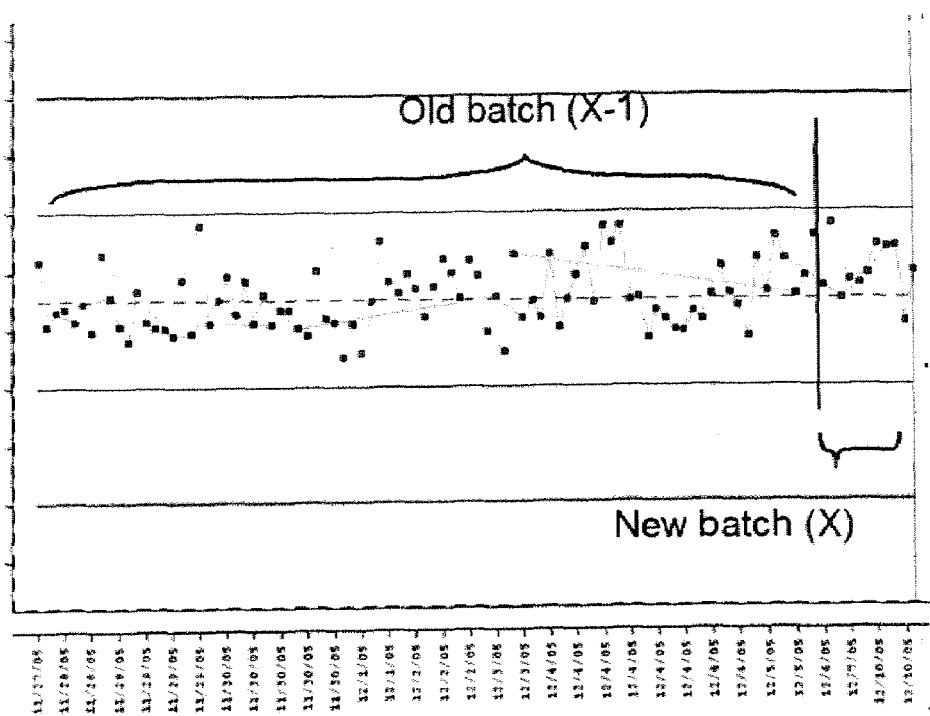
FIG. 7A shows shallow trench isolation (STI) data obtained by CD-SEM measurements taken during a batch change in light sensitive material.
Figure 7B:
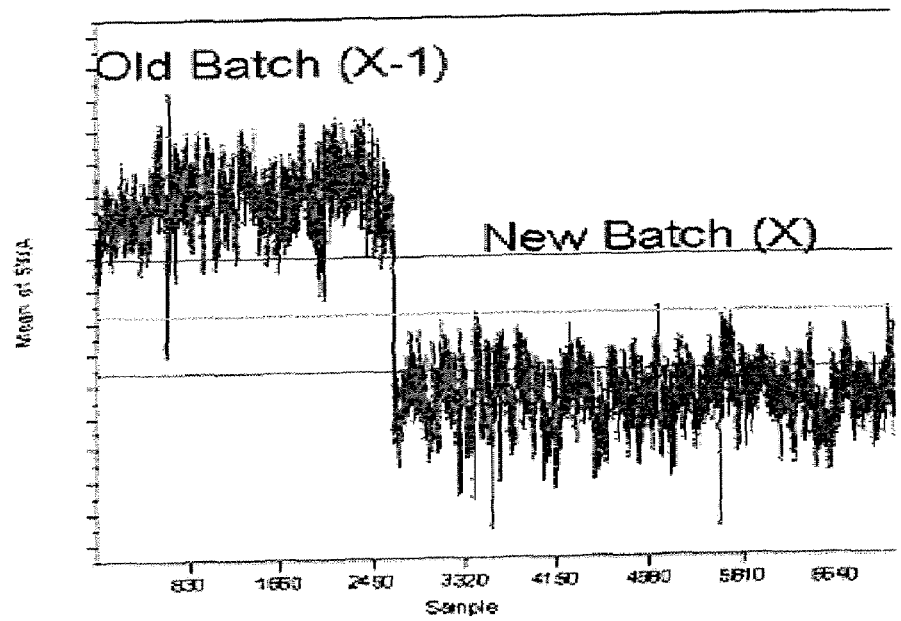
FIG. 7B shows sidewall angle (SWA) data obtained using an ODP measurement tool during the same batch change as in FIG. 8A.

FIG. 7A shows shallow trench isolation (STI) data obtained by CD-SEM measurements taken during a change from resist batch x−1 to batch x associated with the failed etch data. FIG. 7B shows sidewall angle (SWA) data obtained using an ODP measurement tool during the same batch change shown in FIG. 7A. As seen in these figures, the CD-SEM data revealed no appreciable change or out of tolerance condition for the STI measurement at the time batch change, while the ODP data signaled an abrupt drop in SWA measurement of about 0.6 degrees at batch change. Thus, a batch change in light sensitive material can cause a change in photolithography process results that is undetectable by CD-SEM methods, but can lead to out of tolerance post-etch CD measurements that reduce production yields. In particular, conventional CD-SEM measurements of resist patterns may be insufficient to detect pattern profile changes caused by a resist batch change that can ultimately result in etch features that are out of tolerance. Further, CD-SEM measurements of resist patterns are typically done off-line on a sample basis in consideration of photolithography throughput. Where a sampling schedule for the CD-SEM measurement does not coincide with a batch change, the batch change can cause an out of tolerance photolithography process that goes undetected until the next wafer is measured according to the sample plan. This may also lead to etching of out of tolerance wafers and reduced yield. The present invention addresses this problem.

Figure 1:
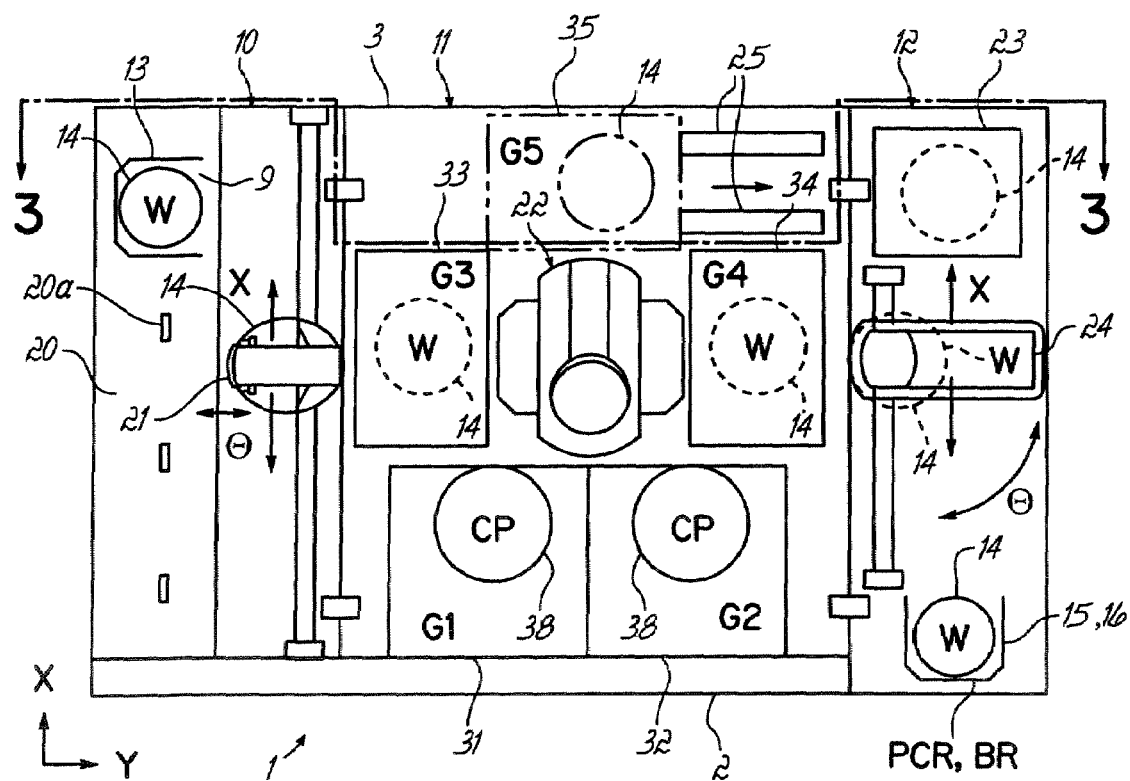
FIG. 1 is a top view of a schematic diagram of a photolithography processing system for use in accordance with embodiments of the invention.
Figure 2:
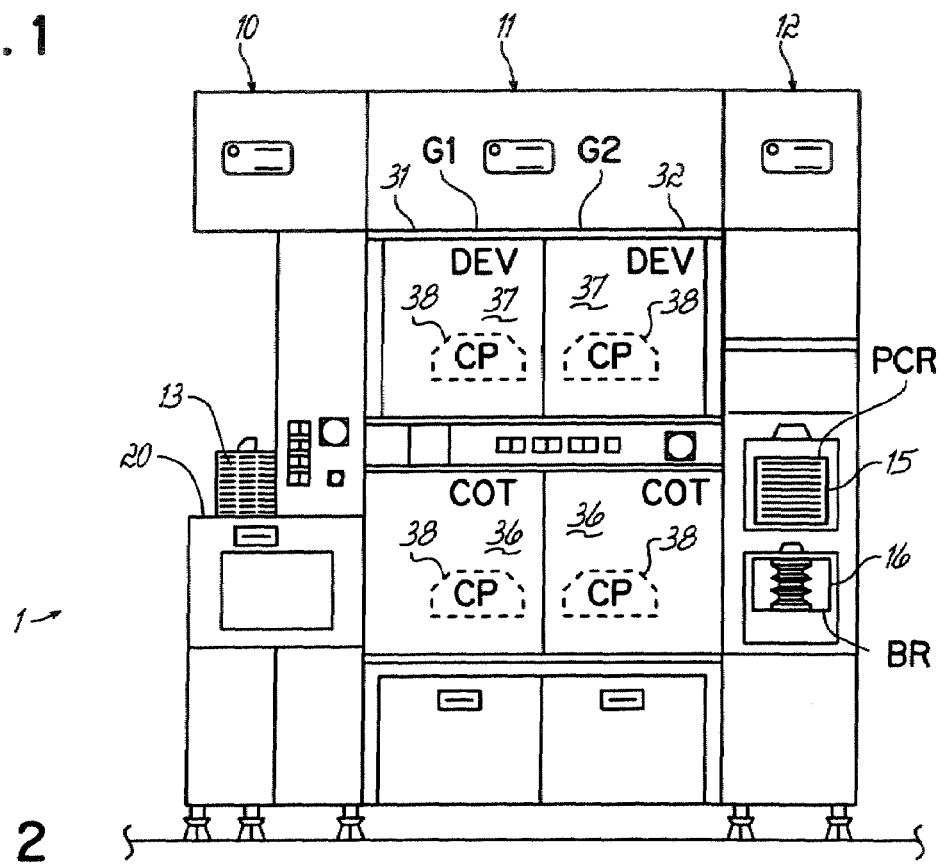
FIG. 2 is a front view of the photolithography processing system of FIG. 1.
Figure 3:
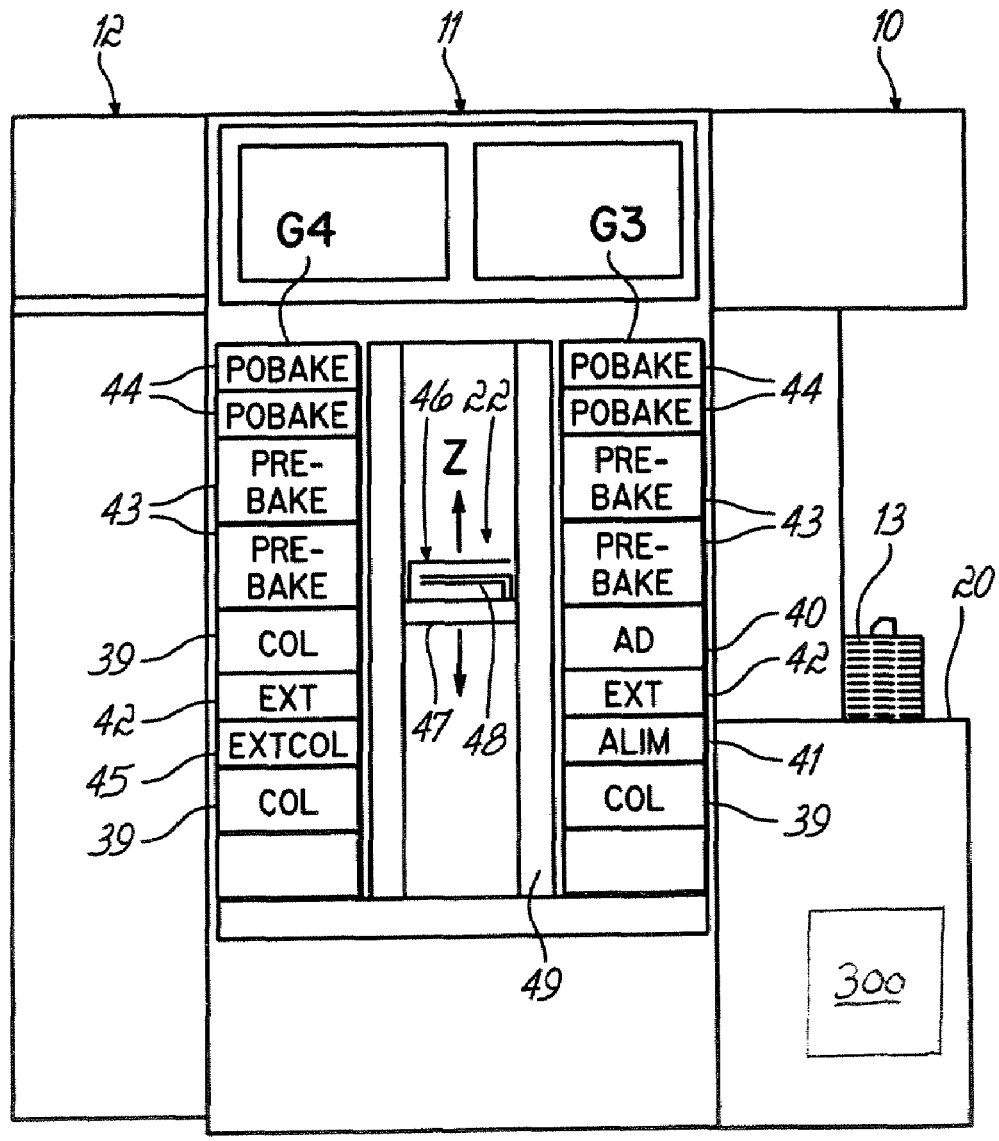
FIG. 3 is a partially cut-away back view of the photolithography processing system of FIG. 1, as taken along line 3-3.

FIGS. 1-3 show a photolithography processing system that may be used to perform photolithography that is monitored based on a batch change in light sensitive material according to embodiments of the present invention. The photolithography processing system 1 (also referred to herein as a "coating/developing processing system") has a load/unload section 10, a process section 11, and an interface section 12. The load/unload section 10 has a cassette table 20 on which cassettes (CR) 13, each storing a plurality of semiconductor wafers (W) 14 (e.g., 25), are loaded and unloaded from the processing system 1. The process section 11 has various single wafer processing units for processing wafers 14 sequentially one by one. These processing units are arranged in predetermined positions of multiple stages, for example, within first (G1), second (G2), third (G3), fourth (G4) and fifth (G5) multiple-stage process unit groups 31, 32, 33, 34, 35. The interface section 12 is interposed between the process section 11 and one or more light exposure systems (not shown), and is configured to transfer resist coated wafers between the process section. The one or more light exposure systems can include a resist patterning system such as a photolithography tool that transfers the image of a circuit or a component from a mask onto the resist on the wafer surface.

In the embodiment of FIGS. 1-3, the coating/developing processing system 1 also includes a CD metrology system for obtaining CD metrology data from test areas on the resist patterned wafers. The CD metrology system may be located within the processing system 1, for example at one of the multiple-stage process unit groups 31, 32, 33, 34, 35, or within the peripheral light exposure system 23 of the interface section 12. Alternatively, the CD metrology system may be external to the coating/developing processing system 1 in accordance with the present invention. The CD metrology system can be a light scattering system, such as an Optical Digital Profilometry (ODP™) system. The ODP system may include a scatterometer, ellipsometer, or reflectometer, all commercially available from Therma-Wave, Inc. (1250 Reliance Way, Fremont, Calif. 94539) or Nanometrics, Inc. (1550 Buckeye Drive, Milpitas, Calif. 95035). ODP software is available from Timbre Technologies Inc. (2953 Bunker Hill Lane, Santa Clara, Calif. 95054).

When performing optical metrology, such as scatterometry, reflectometry, or ellipsometry, a structure on a substrate, such as a semiconductor wafer or flat panel, is illuminated with electromagnetic (EM) radiation, and a diffracted signal received from the structure is utilized to reconstruct the profile of the structure by the ODP software. The structure may include a periodic structure, or a non-periodic structure. Additionally, the structure may include all of, or part of an operating structure on the substrate (i.e., a via or contact hole, or an interconnect line or trench, or a feature formed in a mask layer associated therewith), or the structure may include a periodic grating or non-periodic grating formed proximate to an operating structure or die formed on a substrate. For example, the periodic grating can be formed adjacent a transistor or die formed on the substrate. Alternatively, the periodic grating can be formed in an area of the transistor that does not interfere with the operation of the transistor. The profile of the periodic grating is obtained to determine whether the periodic grating, and by extension the operating structure adjacent the periodic grating, has been fabricated according to specifications. A plurality of projections 20a are formed on the cassette table 20. A plurality of cassettes 13 are each oriented relative to the process section 11 by these projections 20a. Each of the cassettes 13 mounted on the cassette table 20 has a load/unload opening 9 facing the process section 11.

The load/unload section 10 includes a first sub-arm mechanism 21 that is responsible for loading/unloading the wafer W into/from each cassette 13. The first sub arm mechanism 21 has a holder portion for holding the wafer 14, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a 0 (theta) rotation mechanism (not shown) for swinging the holder portion around the Z-axis. The first sub-arm mechanism 21 can gain access to an alignment unit (ALIM) 41 and an extension unit (EXT) 42 belonging to a third (G3) process unit group 33, as further described below.

With specific reference to FIG. 3, a main arm mechanism 22 is liftably arranged at the center of the process section 11. The process units G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle of 8. The wafer transporting system 46 has a plurality of holder portions 48 movable in a front and rear direction of a transfer base table 47.

Units belonging to first (G1) and second (G2) process unit groups 31, 32 are arranged at the front portion 2 of the coating/developing processing system 1. Units belonging to the third (G3) process unit group 33 are arranged next to the load/unload section 10. Units belonging to a fourth (G4) process unit group 34 are arranged next to the interface section 12. Units belonging to a fifth (G5) process unit group 35 are arranged in a back portion 3 of the processing system 1.

With reference to FIG. 2, the first (G1) process unit group 31 has two spinner-type process units for applying a predetermined treatment to the wafer 14 mounted on a spin chuck (not shown) within the cup (CP) 38. In the first (G1) process unit group 31, for example, a resist coating unit (COT) 36 and a developing unit (DEV) 37 are stacked in two stages sequentially from the bottom. In the second (G2) process unit group 32, two spinner type process units such as a resist coating unit (COT) 36 and a developing unit (DEV) 37, are stacked in two stages sequentially from the bottom. In an exemplary embodiment, the resist coating unit (COT) 36 is set at a lower stage than the developing unit (DEV) 37 because a discharge line (not shown) for the resist waste solution is desired to be shorter than a developing waste solution for the reason that the resist waste solution is more difficult to discharge than the developing waste solution. However, if necessary, the resist coating unit (COT) 36 may be arranged at an upper stage relative to the developing unit (DEV) 37.

With reference to FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom. Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom.

In an exemplary embodiment, the cooling unit (COL) 39 and the extension cooling unit (EXTCOL) 45, to be operated at low processing temperatures, are arranged at lower stages, and the prebaking unit (PREBAKE) 43, the postbaking unit (POBAKE) 44 and the adhesion unit (AD) 40, to be operated at high temperatures, are arranged at the upper stages. With this arrangement, thermal interference between units may be reduced. Alternatively, these units may have different arrangements.

At the front side of the interface section 12, a movable pick-up cassette (PCR) 15 and a non-movable buffer cassette (BR) 16 are arranged in two stages. At the backside of the interface section 12, a peripheral light exposure system 23 is arranged. The peripheral light exposure system 23 can contain a lithography tool and an Optical Digital Profilometry (ODP™) system. Alternately, the lithography tool and the ODP system may be remote to and cooperatively coupled to the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of 0 and is designed to be able to gain access not only to the extension unit (EXT) 42 located in the fourth (G4) processing unit 34 but also to a wafer transfer table (not shown) near the light exposure system (not shown).

In the processing system 1, the fifth (G5) processing unit group 35 may be arranged at the back portion 3 of the backside of the main arm mechanism 22. The fifth (G5) processing unit group 35 may be slidably shifted in the Y-axis direction along a guide rail 25. Since the fifth (G5) processing unit group 35 may be shifted as mentioned, maintenance operations may be applied to the main arm mechanism 22 from the back side.

As schematically shown in FIG. 3, the photolithography processing system 1 can include a control system 300 that coordinates the operation of the COT subsystems, DEV subsystems, and other subsystems within the system 1. Furthermore, the control system 300 can control the automated transport of wafers between the different stations in the system 1.

The control system 300 includes a microprocessor, memory, and a digital I/O port (potentially including D/A and/or A/D converters) capable of generating control voltages sufficient to communicate and activate inputs to, as well as monitor outputs from, each of the stations of the photolithography processing system 1. The control system 300 communicates with the stations of system 1 using any suitable protocol. A program stored in the memory is utilized to interact with the aforementioned stations in FIG. 1 according to a stored process or inspection recipe, for example. One example of control system 300 is a DELL PRECISION WORKSTATION 640™, available from Dell Corporation, Austin, Tex. The control system may also be part of the fabrication system's host controller, which is a complex combination of hardware and software controls and communication protocols directed to overall control of the fabrication system.

The control system 300 may also be implemented as a general purpose computer, processor, digital signal processor, etc., which causes a photolithography processing system 1 to perform a portion or all of the processing steps of the invention in response to the control system 300 executing one or more sequences of one or more instructions contained in a computer readable medium. The computer readable medium or memory is configured to hold instructions programmed according to the teachings of the invention and can contain data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Control system 300 may be locally located relative to the photolithography processing system as shown in FIG. 3, or it may be remotely located relative to this system. Thus, control system 300 can exchange data with the system 1 and/or its stations using at least one of a direct connection, an intranet, or the internet. Control system 300 may be coupled to an intranet at a customer site (i.e., a device maker, etc.), or coupled to an intranet at a vendor site (i.e., an equipment manufacturer). Furthermore, another computer (i.e., controller, server, etc.) can access control system 300 to exchange data via at least one of a direct connection, an intranet, or the internet.

When fabricating a wafer, as noted above, the control system 300 can run a process recipe and an inspection recipe, each of which specifies the steps and their order necessary to complete the fabrication of the wafer. These recipes can be stored at central storage of the central control system 300, or stored in a remote storage location, or distributed among two or more storage locations. Further the recipes can be executed by the control system 300, individual controllers (not shown) associated with the stations of system 1, or from a remote controller unit.

Figure 4:
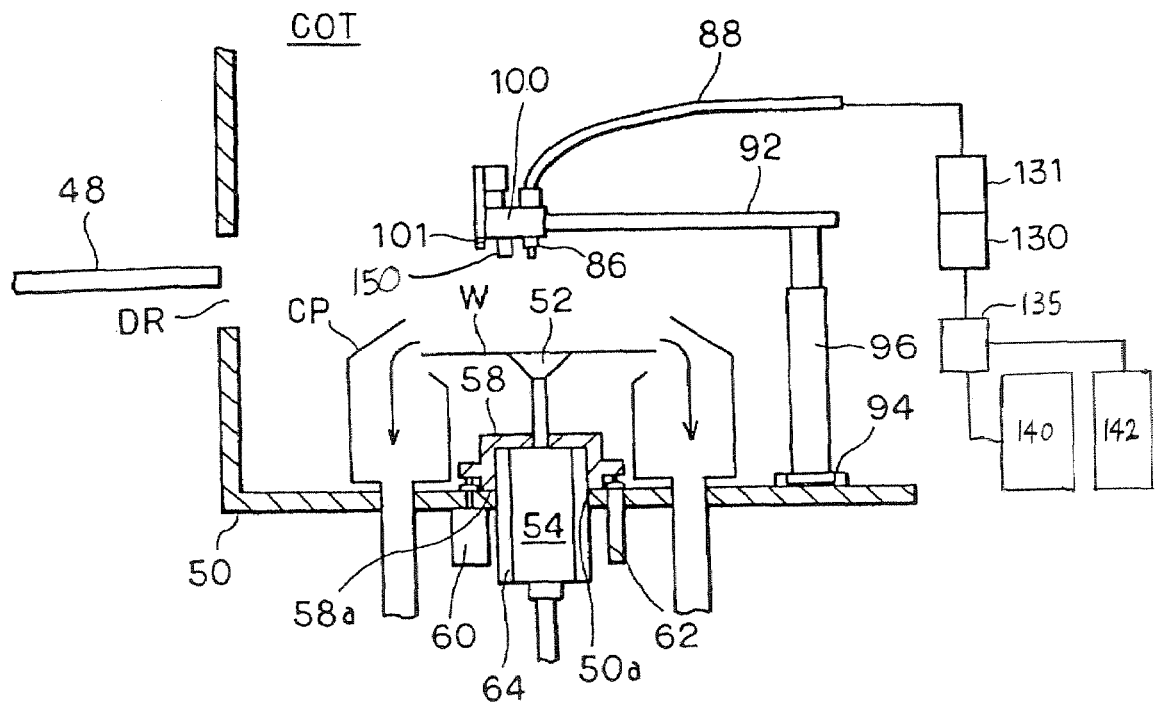
FIG. 4 is a sectional view showing the whole structure of a light sensitive material coating processing unit installed in the photolithography processing system shown in FIG. 1.
Figure 5:
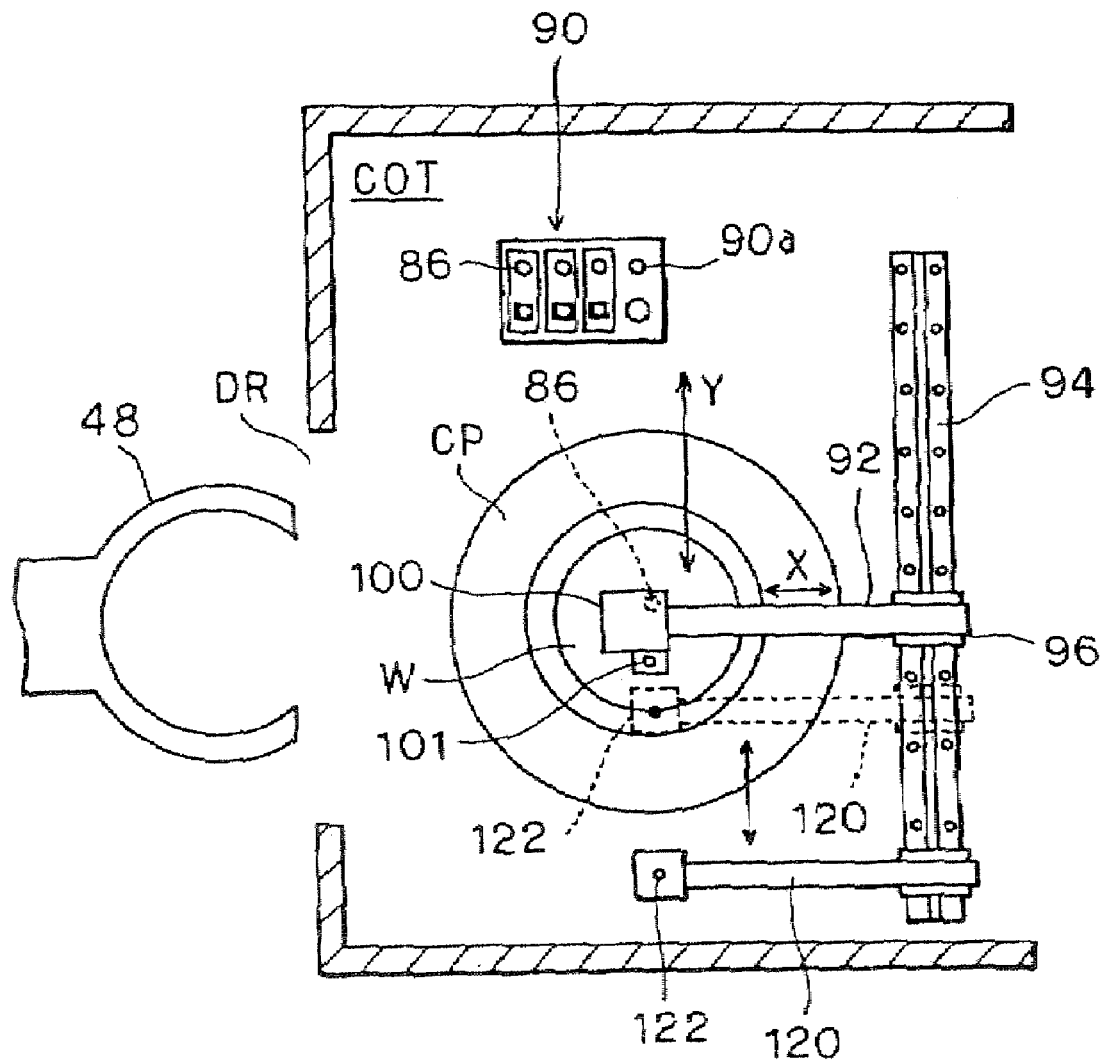
FIG. 5 is a plan view of the coating processing unit shown in FIG. 4.

FIG. 4 is a sectional view and FIG. 5 is a plan view showing a structure of the resist coating processing unit (COT) that may be used to perform a photolithography process that is monitored based on a batch change in light sensitive material according to embodiments of the present invention. As seen in these figures, a ring-shaped cup CP is disposed at the center of the resist coating processing unit (COT), and a spin chuck 52 is disposed inside the cup CP. The spin chuck 52 is rotationally driven by a drive motor 54 while securely holding a wafer W by vacuum adherence. The drive motor 54 is disposed within an opening 50*a* provided in a unit bottom plate 50 to be ascendable and descendable, and is linked together with an ascent/descent drive means 60 consisting of, for example, an air cylinder and an ascent/descent guide means 62 with a cap-shaped flange member 58 made of, for example, aluminum therebetween.

On the side face of the drive motor 54, a cylindrical cooling jacket 64 made of, for example, SUS is attached, and the flange member 58 is attached in such a manner to cover the upper half of the cooling jacket 64.

When a resist is applied, a bottom end 58*a* of the flange member 58 contacts the unit bottom plate 50 in the vicinity of the periphery of the opening 50*a*, thereby keeping the inside of the unit airtight. When the wafer W is delivered between the spin chuck 52 and the holding members 48 of the main wafer transfer mechanism 22, the ascent/descent drive means 60 lifts the drive motor 54 or the spin chuck 52 upward, thereby the bottom end of the flange member 58 is ascended away from the unit bottom plate 50.

A resist nozzle 86 for discharging a resist solution onto the front face of the wafer W is joined to a resist supply pipe 88 to which an air-operated valve 130 and a suck back valve 131 are joined. The resist nozzle 86 is removably attached to the tip portion of a resist nozzle scan arm 92 with a nozzle holder 100 therebetween. The resist nozzle scan arm 92 is attached to the top end portion of a vertical support member 96 which can horizontally move on guide rails 94 laid on the unit bottom plate 50 in one direction (the Y-direction), so that it moves in the Y-direction integrally with the vertical support member 96 by a Y-direction drive mechanism (not shown).

Typically, resist batch changes take place as needed during photolithography production without interrupting production. Thus, the resist supply system in FIG. 4 includes a first container 140 containing a first batch of resist, and a second container 142 containing a second batch of resist, both containers supplying one set of resist pumps (not shown). Each container 140 and 142 can supply resist to the resist nozzle 88 via a batch change mechanism 135, as well as air-operated valve 130, a suck back valve 131 and resist supply pipe 88. When container 140 becomes empty, for example, the batch change mechanism 135 automatically switches over to container 142 so that the process can continue uninterrupted. The batch change mechanism may be implemented as a valve for directing the flow of resist from the containers 140 and 142. However, more complex mechanisms can be used to switch containers 140 and 142. While the batch change mechanism 135, air-operated valve 130, a suck back valve 131 are shown to be in line with the resist supply containers 140 and 142, it is understood that this is merely a schematic representation and these items may perform their respective functions without having the resist supply pass therethrough. In this regard, a resist feed system includes pipes, hoses, valves and any other contained passageway for delivering resist from the resist container 140 or 42 to the resist nozzle 86.

The resist nozzle scan arm 92 can move also in the X-direction orthogonal to the Y-direction for selectively attaching a resist nozzle 86 thereto at a resist nozzle standby section 90, and hence it moves also in the X-direction by an X-direction drive mechanism (not shown).

Further, a discharge port of the resist nozzle 86 is inserted into an aperture 90*a* of a solvent atmosphere chamber at the resist nozzle standby section 90 to be exposed to the atmosphere of the solvent therein, so that a resist solution at the nozzle tip does not solidify nor deteriorate. Moreover, a plurality of resists nozzles 86 are provided and these nozzles are properly used, for instance, corresponding to the type of resist solution.

Attached to the tip portion (the nozzle holder 100) of the resist nozzle scan arm 92 is a thinner nozzle 101 for discharging a solvent onto the front face of the wafer in advance of the discharge of the resist solution onto the front face of the wafer, for example, a thinner. The thinner nozzle 101 is joined to a thinner supply section with a solvent supply pipe (not shown) therebetween. The thinner nozzle 101 and the resist nozzle 86 are attached in such a manner that the respective discharge ports are positioned above a straight line along the Y-movement direction of the resist nozzle scan arm 92.

In the embodiment of FIG. 4, a sensor 150 may also be mounted in a vicinity of the nozzle 86 to detect a characteristic of the resist dispensed from the nozzle. For example, the sensor 150 may be a viscosity sensor for detecting a viscosity of the resist dispensed from the nozzle 86 such that a change in viscosity between first and second batches of resist can indicate a change in the batch of resist applied to the wafer face. The sensor may alternatively detect a concentration of a particular component in the resist, or any other characteristic of the resist that can signal a change in resist batch in accordance with embodiments of the invention, as further discussed below. Alternatively, sensor 150 may be installed anywhere along resist supply pipe 88.

On the guide rails 94, provided are not only the vertical support member 96 for supporting the resist nozzle scan arm 92 but also a vertical support member 122 for supporting a side rinse nozzle scan arm 120 and movable in the Y-direction. A rinse nozzle 124 for side rinse is attached to the tip portion of the rinse nozzle scan arm 120. The Y-direction drive mechanism (not shown) translates or linearly moves the side rinse nozzle scan arm 120 and the rinse nozzle 124 between a side rinse nozzle standby position (a position shown by the solid line) which is set beside the cup CP and a rinse solution discharge position (a position shown by the dotted line) which is set direct above the peripheral portion of the wafer W mounted on the spin chuck 52.

Control of the resist coating processing unit (COT) may be performed by the system controller 300 described above, or by a dedicated control system of the resist coating processing unit (COT). A controller of the coating processing unit controls each of sections in the resist coating processing unit (COT). For instance, it controls the drive motor 54 for rotating a wafer W, the air operated valve 130 for switching between supply and stop of a resist solution, the suck back valve 131 for sucking back the resist solution, and a thinner supply section 132 for supplying or stopping a thinner, the batch change mechanism for changing between batches of resist etc. Connected to the controller is a storage section in which recipe and other information required for processing is kept.

Figure 6:
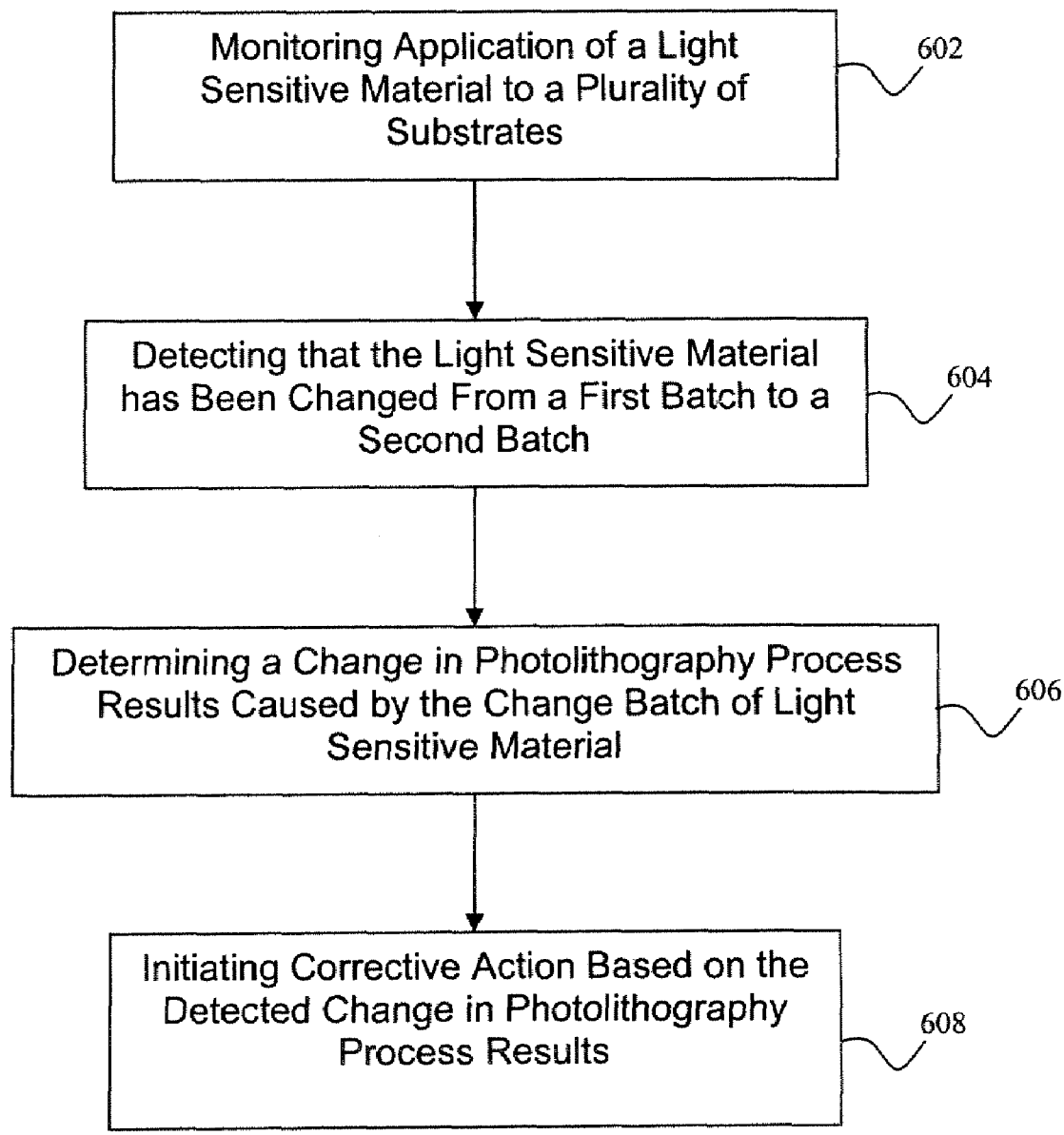
FIG. 6 is a flow chart depicting a method for monitoring photolithography processing in accordance with an embodiment of the invention.

FIG. 6 is a flow chart depicting a method for monitoring photolithography processing in accordance with an embodiment of the invention. As seen in this figure, the process 600 begins with monitoring the application of light sensitive material to the surface of a plurality of substrates in step 602. The monitoring step 602 may include detecting that resist has been applied to a wafer surface by monitoring control signals that cause the light sensitive material to be dispensed. For example, step 602 may include monitoring of control signals operating the air valve 130 in FIG. 4. Alternatively, the monitoring step 602 can be a more active sensing of the physical application of resist to the surface of each wafer.

In step 604 it is detected that the light sensitive material applied to the substrates has been changed from a first batch of light sensitive material to a second batch light sensitive material. This detection step may be a simple detection that a new container of light sensitive material is supplying a nozzle for dispensing the material. As noted above, a typical supply system for light sensitive material includes two containers that supply one set of resist pumps, as shown in FIG. 4, and sensors typically determine when a container is empty in order to initiate automatic switching to a new resist supply. Thus, the detecting step 604 may include detecting a signal indicating that a first container containing the first batch of light sensitive material (for example container 140 in FIG. 4) is empty, and/or detecting a signal indicating that the supply has been switched to a second container containing the second batch of light sensitive material (for example 142 in FIG. 4).

Detecting a change in containers of light sensitive material may be used to identify a first substrate that will receive the new batch of light sensitive material thereon. Once the supply system switches to a new container of light sensitive material, there is a delay until that new material is transported from the new container through the feed system and dispensed onto the wafer surface. In one embodiment of the invention, a controller can determine when the first batch of light sensitive material will be exhausted from the feed system and the second batch of light sensitive material will begin to be dispensed onto the substrates Specifically, the volume of the various components in the feed system for light sensitive material is generally known from manufacturer's specifications, or can be easily be determined. Further, the amount of light sensitive material dispensed by a feed pump is typically tracked in the photolithography system for other process functions. Thus, once a controller of the photolithography system detects that the supply system has automatically switched to the new container of light sensitive material as described above, a controller can perform the following calculation to determine when the new resist is dispensed onto the substrate:

$$\Sigma N = V$$

where N=pump dispense amount

V=volume of feed system between the container and dispense point.

Monitoring dispense volumes may be more complex where a solvent supply system feeds multiple pumps, however the solvent supply system tubing lengths can also be obtained and used to provide an accurate calculation.

This calculation can be done in real time to identify the first substrate that is receiving the new light sensitive material as this first substrate is being coated. Alternatively, where the amount of light sensitive material dispensed on each substrate is also known, a calculation can be done in advance to determine which substrate in a process sequence will receive the new batch of light sensitive material before that substrate is actually coated. This information may be fed forward for use by the controller of the coating apparatus. For example, an estimate of when the new batch of light sensitive material will be dispensed from the feed system may be used to purge a small amount of first batch material from the feed system to ensure that a single wafer does not receive both first and second light sensitive material applied thereto.

The detection of a change in the light sensitive material container may also be used to initiate ODP measurements for identifying a first substrate to which the new batch of light sensitive material is applied. As noted above, ODP measurements are effective in detecting sidewall angle (SWA) changes associated with a resist batch change. Where an ODP tool is available, after detecting the change to a second container, ODP measurements can be performed on the substrates to identify the first substrate receiving the new resist based on a change in ODP measurement results from wafer to wafer. These ODP measurement results may also be used to determine a change in photolithography process results caused by the change from the first batch to the second batch of light sensitive material, as further discussed below.

A first substrate to which a new batch of light sensitive material is applied can also be identified without regard to a change in the supply containers. For example, a sensor such as the sensor 150 of FIG. 4 can be included near the resist dispense point to monitor a characteristic of the light sensitive material applied to the substrate surface. The characteristic should be a characteristic that varies from batch to batch of light sensitive material. For example, the characteristic may be viscosity of the light sensitive material, a concentration of a chemical component of the light sensitive material, or any other characteristic that changes from batch to batch. Thus, the sensor can detect a change in the characteristic representing a change from the first batch of light sensitive material to the second batch of light sensitive material. Further, the substrate that is being processed when the change in characteristic occurs can be identified as the first substrate to receive the new batch of resist.

In one embodiment, a monitored characteristic can vary with age of the light sensitive material thereby allowing detection of aging of the light sensitive material that can cause a change in photolithography processing. Thus, a change from a first batch of light sensitive material to a second batch light sensitive material detected in step 604 may not be a physical change in batch containers as described above, but rather can be a transformation of the material in a single container, e.g. the first batch itself. For example, a single container of light sensitive material may age sufficiently to cause the light sensitive material to change from a first batch of light sensitive material to a second batch light sensitive material having different characteristics that can cause process variation without any physical batch changes. In other words, for the purpose of this embodiment, the same material of the first batch is considered being a second batch after it has aged sufficiently so its characteristics have changed also. Further, a predetermined age of the light sensitive material may be known to potentially cause a change in photolithography process results. Thus, step 604's detecting a change from a first batch of light sensitive material to a second batch light sensitive material may include monitoring the age of a container of material, and upon reaching the predetermined age, presuming that the light sensitive material changed from a first batch to a second batch. This presumption can initiate testing of subsequent wafers.

Once the batch change of light sensitive material is determined in step 604, a change in photolithography process results caused by the batch change is determined in step 606. In one embodiment, determination of the change in photolithography process results includes performing ODP measurements of a feature formed in the light sensitive material applied on the substrate, and detecting a change in a profile of the feature caused by the change in batch of light sensitive solution. The change in profile may be detected based on sidewall angle (SWA) measurements, as discussed above.

Further, the ODP measurements can be performed on an in-line ODP system integrated into a photolithography system that is performing the photolithography process, such as that described with respect to FIGS. 1-3.

In one embodiment, batch change data resulting from step 604 can be fed forward to the inline ODP metrology unit. As noted above, the batch change data can be used by the in-line ODP system to identify a first wafer that receives a new batch of resist thereon. For example, where the batch change data includes only batch container change information, the batch change data can signal the in-line ODP system to immediately begin measurements on wafers to identify the first wafer receiving the new light sensitive material based on a wafer-to-wafer ODP measurement change. Where the batch change data fed forward to the ODP measurement system already includes an identification of the first wafer that will receive the new light sensitive material (based on calculation or monitoring of a material characteristic, for example), then the batch change data can signal the ODP system to begin measurements on that first wafer. ODP measurements may be performed on a predetermined number of wafers.

Thus, fed forward batch change data can be used by the inline ODP system to modify a sampling scheme to better capture/characterize a potential process variation due to a change in light sensitive material. For example, if the inline ODP system is set up in a wafer sampling mode, then the wafer sampling plan can be changed to enable measurement of a predetermined number of wafers at risk, or only the first wafer at risk if this is identified. Similarly, the batch change data could signal the inline ODP system to perform measurements according to a predetermined measurement recipe that is configured to capture/characterize a potential photolithography process variation caused by a change in the light sensitive material. For example, the batch change data could signal a change in the number of measurement sites for a wafer.

In addition, once in-line ODP measurements are taken, the batch change data can be attached to the measurement results and uploaded to the fab host. This information could be noted on host level SPC charts to help identify and analyze photolithography process changes.

Where an in-line ODP measurement system is not available for the photolithography system, step 606 may include sending batch change data to the host so that a change in photolithography process results caused by the batch change can be determined by other means. For example, the batch change data can create a note in the host log that a batch change occurred, and alert the host to immediately initiate off-line (i.e. standalone) ODP measurements of the wafers at risk. As with in-line ODP testing, the off-line ODP tests may be performed on a predetermined number of wafers, or only a first wafer having the new light sensitive material if this wafer is identified. Further, the off-line ODP tests can be performed according to a predetermined measurement recipe configured to determine if a photolithography process variation has occurred.

Alternatively, other off-line testing may be performed in step 606. For example, an enhanced CD-SEM measurement process including a larger number of measurement sites can be performed to improve detection accuracy for the substrates. Alternatively, the batch change data can alert the host to immediately initiate photolithography processing of test wafers (instead of product wafers) that can be analyzed to determine if a process variation will occur. Still alternatively, post-etch inspection results can be used to determine a change in photolithography process results caused by the batch change in light sensitive material. As discussed above, post-etch measurements of the substrates can shift out of tolerance and process corrections must be made. Because the present invention detects a batch change, post-etch inspection failures can be automatically correlated to the batch change so that appropriate correction of the photolithography process is performed rather than unnecessary changes made to the etch process, that may be undesirable. As would be understood by one of ordinary skill in the art, once a batch change takes place, according to the present invention, a variety of different inspection techniques can be used in step 606 to determine a change in photolithography process results caused by the batch change. For example, destructive testing, end of line electrical testing, atomic force microscope (AFM) measurements or any other known techniques having sufficient sensitivity to detect a photolithography change caused by the batch change.

Once the change in photolithography process results is determined, corrective action is initiated in step 608. The corrective action of step 608 depends on the nature of the process change determined in step 606. For example, where the process change is insignificant, the corrective action may simply be to note the process change in a history file or on a host SPC chart without any change to the photolithography or etch processes. Where the process change is more significant, step 608 can include a change to the photolithography or etch processes. Specifically, the corrective action can include changing an exposure, developing or other process step of the photolithography processing recipe to compensate for the change in process results. Similarly, the corrective action can include changing a recipe of an etching process performed after said photolithography processing to compensate for said change in photolithography process results caused by the change the first batch to the second batch of light sensitive material.

Thus, the present invention provides a determination of when a process result may change due to resist batch change, and can feed forward that information to an inline ODP system or the fab host to reduce the number of wafers that are normally at risk between the time a process variation occurs and when it can be detected and corrected. Currently, wafers are measured on a CD-SEM to look for process result changes; however, this can result in failed post-etch measurements and reduced yield as discussed above. Another way to reduce at risk wafers is to purge the old resist after a batch change and then run test wafers through the track to verify that the process is still stable. However, this wastes resist and causes lost production time. The present invention can provide a fully automated approach to solving these problems. It removes the downtime associated with running test wafers and removes the latency involved with off-line metrology.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for monitoring photolithography processing, comprising:
   monitoring application of a light sensitive material to the surface of each of a plurality of substrates;
   detecting that a supply of the light sensitive material applied to the substrates has changed from a first batch of light sensitive material to a second batch of light sensitive material;
   determining a change in photolithography process results caused by the change from the first batch to the second batch of light sensitive material; and initiating corrective action based on the change in photolithography process results.

2. The method of claim 1, wherein said detecting comprises identifying a first substrate that the second batch of light sensitive material is applied to.

3. The method of claim 2, wherein said identifying comprises:
detecting when a system that supplies the light sensitive material changes from a first container containing the first batch of light sensitive material to a second container containing the second batch of light sensitive material;
determining when the first batch of light sensitive material is exhausted from a feed system and the second batch of light sensitive material begins to be dispensed from the feed system onto the substrates based on a feed rate of the light sensitive material and a volume of the feed system; and
identifying a substrate that will receive light sensitive material when the second batch of light sensitive material begins to be dispensed from the feed system as the first substrate.

4. The method of claim 2, wherein said identifying comprises:
monitoring a characteristic of the light sensitive material applied to the substrates;
detecting a change in said characteristic representing a change from the first batch of light sensitive material to the second batch of light sensitive material; and
identifying a substrate that will receive light sensitive material when said change in characteristic occurs as the first substrate.

5. The method of claim 4, wherein said characteristic comprises a viscosity of the light sensitive material.

6. The method of claim 4, wherein said characteristic comprises a concentration of a component of the light sensitive material.

7. The method of claim 2, wherein said identifying comprises:
detecting when a system that supplies the light sensitive material changes from a first container containing the first batch of light sensitive material to a second container containing the second batch of light sensitive material; and
after detecting said change to a second container, performing an optical metrology measurement on said substrates to identify said first substrate based on a change in optical metrology measurement results from wafer to wafer.

8. The method of claim 7, wherein said determining a change in photolithography process results caused by the change from the first batch to the second batch of light sensitive material is performed based on said optical metrology measurement results.

9. The method of claim 1, wherein said detecting comprises detecting an age of the supply of the light sensitive material applied to the substrates, wherein a predetermined age causes the light sensitive material to change from said first batch of light sensitive material to said second batch of light sensitive material.

10. The method of claim 1, wherein said determining comprises:
performing optical metrology measurements of a feature formed in the light sensitive material applied on the substrate;
detecting a change in a profile of the feature caused by the change in batch of light sensitive material.

11. The method of claim 10, wherein said performing comprises performing said optical metrology measurements on an in-line optical metrology system integrated into a photolithography system that is performing the photolithography process.

12. The method of claim 11, further comprising feeding forward batch change data resulting from said determining step to the in-line optical metrology system.

13. The method of claim 12 further comprising using said batch change data to modify a sampling plan in the optical metrology measurement system.

14. The method of claim 12, further comprising using said batch change data to select a predetermined optical metrology measurement recipe configured to detect said change in profile of the feature caused by the change in batch of light sensitive solution.

15. The method of claim 12, further comprising sending a batch change signal and results of said optical metrology measurement from the photolithography system to a fab host computer.

16. The method of claim 10, wherein said performing comprises performing said optical metrology measurements on an off-line optical metrology system that is not integrated into a photolithography system that is performing the photolithography process.

17. The method of claim 16, further comprising identifying a first substrate that the second batch of light sensitive material is applied to, wherein said performing comprises performing said optical metrology measurements on said first substrate.

18. The method of claim 16, wherein said performing comprises performing said optical metrology measurements at a predetermined measurement recipe configured to detect said change in profile of the feature caused by the change in batch of light sensitive solution.

19. The method of claim 2, wherein said determining comprises performing an predetermined inspection on at least the first substrate, said predetermined inspection being configured to detect a change in photolithography processing results based on a change in batch of light sensitive solution.

20. The method of claim 19, wherein said predetermined inspection comprises a scanning electron microscope (SEM) inspection of at least the first substrate.

21. The method of claim 19, wherein said predetermined inspection comprises a post etch inspection of at least the first substrate.

22. The method of claim 1, wherein said corrective action comprises changing a recipe of the photolithography processing to compensate for said change in photolithography process results caused by the change of the first batch to the second batch of light sensitive material.

23. The method of claim 22, wherein said changing a recipe comprises changing an exposure step or a developing step or both of these to compensate for said change in photolithography process results caused by the change from the first batch to the second batch of light sensitive material.

24. The method of claim 1, wherein said corrective action comprises changing recipe of an etching process performed after said photolithography processing to compensate for said change in photolithography process results caused by the change from the first batch to the second batch of light sensitive material.

25. A system for monitoring photolithography processing, comprising:
a coating device configured to apply light sensitive material to the surface of each of a plurality of substrates;

a detector configured to detect that a supply of the light sensitive material applied to the substrates has changed from a first batch of light sensitive material to a second batch of light sensitive material; and an inspection device configured to determine a change in photolithography process results caused by the change from the first batch to the second batch of light sensitive material.

26. The system of claim 25, wherein said detector comprises a controller configured to:

detect when a system that supplies the light sensitive material changes from a first container containing the first batch of light sensitive material to a second container containing the second batch of light sensitive material;

determine when the first batch of light sensitive material is exhausted from a feed system and the second batch of light sensitive material begins to be dispensed from the feed system onto the substrates based on a feed rate of the light sensitive material and a volume of the feed system; and identify a first substrate that will receive light sensitive material when the second batch of light sensitive material begins to be dispensed from the feed system.

27. The system of claim 26, wherein said detector comprises:

a sensor configured to monitor a characteristic of the light sensitive material applied to the substrates; and a controller configured to detect a change in said characteristic representing a change from the first batch of light sensitive material to the second batch of light sensitive material and identify a first substrate that will receive light sensitive material when said change in characteristic occurs.

28. The system of claim 25, wherein said detector comprises an in-line optical metrology system or an off-line optical metrology system.

29. The system of claim 25, wherein said inspection device comprises an in-line optical metrology system or an off-line optical metrology system.

30. The system of claim 27, wherein said sensor comprises a viscosity measurement device.

31. The system of claim 27, wherein said sensor comprises a chemical species concentration detector.

* * * * *